United States Patent
Turner

(10) Patent No.: US 6,396,890 B1
(45) Date of Patent: May 28, 2002

(54) PHASE CORRECTED FREQUENCY SYNTHESIZERS

(75) Inventor: Neil William Ashley Turner, Devizes (GB)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/352,173

(22) Filed: Jul. 12, 1999

(51) Int. Cl.$^7$ .................................................. H03D 3/24
(52) U.S. Cl. ........................................ 375/376; 327/156
(58) Field of Search .............................. 375/373, 375, 375/376; 327/141, 142, 147, 150, 156–159

(56) References Cited

U.S. PATENT DOCUMENTS

| | | | |
|---|---|---|---|
| 4,980,652 A | * | 12/1990 | Tarusawa et al. ............ 331/1 A |
| 5,202,906 A | * | 4/1993 | Saito et al. .................. 327/105 |
| 5,521,947 A | * | 5/1996 | Madsen ....................... 327/156 |

FOREIGN PATENT DOCUMENTS

| | | |
|---|---|---|
| EP | 0272938 A2 | 12/1987 |
| EP | 0360442 A1 | 9/1989 |
| GB | 2233176 A | 1/1991 |
| GB | 2289175 A | 11/1995 |
| GB | 2289384 A | 11/1995 |

* cited by examiner

Primary Examiner—Stephen Chin
Assistant Examiner—Lenny Jiang
(74) Attorney, Agent, or Firm—John B. MacIntyre; Lalita P. Williams

(57) ABSTRACT

A frequency synthesizer of the phase locked loop type and particularly useful for frequency hopping applications includes means (8) for achieving fast frequency and phase lock. In one embodiment the synthesizer is steered to a new frequency value by a DAC 10 which controls a VCO (5) input voltage. Subsequently, the phase of the synthesizer output is locked to that of the reference frequency oscillator (1) by resetting the feedback frequency divider (6) at the point in time when a rising edge of the reference frequency is detected. In a second embodiment, rapid frequency and phase lock is achieved by resetting the feedback frequency divider (6) on every rising edge of the reference frequency while the feedback loop is disabled, until the detected phase difference between the reference frequency and the divided VCO frequency reaches a minimum value.

13 Claims, 3 Drawing Sheets

PHASE CORRECTED FREQUENCY SYNTHESIZERS

BACKGROUND OF THE INVENTION

This invention relates to frequency synthesizers of the type which employ a phase locked loop for their operation.

Frequency synthesizers are commonly employed in communications, transmitters and receivers for deriving a large number of discrete frequencies from a single source.

DESCRIPTION OF THE PRIOR ART

FIG. 1 illustrates the basic mode of operation of a known synthesizer. It incorporates a stable crystal oscillator 1 which acts as a reference source, a phase detector 2 coupled to a charge pump 3, a passive low pass loop filter 4 and a voltage controlled oscillator (VCO) 5. The phase detector 2 and charge pump 3 produce a DC control voltage dependant upon the phase difference between the crystal oscillator I and the VCO 5 output signals. This control voltage is filtered to remove any unwanted AC components and then applied to the VCO 5 to vary its frequency. The action of this phase locked loop ensures that the frequency or phase of the VCO 5 changes in the direction that reduces any difference in frequency or phase between the reference ($f_R$) and the VCO output ($f_c$). Once lock has been achieved, the two inputs to the phase detector 2 are at the same frequency and in phase.

To obtain more than one frequency from the VCO 5, a frequency divider (e.g. ÷ N (counter)) 6 is inserted into the feedback loop 7 between the VCO 5 and the phase detector 2. Signals applied to the phase detector 2 are then at frequencies $f_R$ and $f_c/N$ and the VCO 5 runs at a frequency of $Nf_R$. Thus, the incorporation of a programmable ÷N (counter) in the loop allows a large number of discrete frequencies to be generated by altering the value of N. The increments in frequency that can be obtained are, of course, equal to the reference frequency $f_R$.

The phase detector 2 is usually a digital device having an "up" and a "down" output, both being connected to the charge pump 3, which in turn acts to supply current or to draw it from the loop filter 4 depending upon the state of the "up" and "down" outputs.

The switching speed of a frequency synthesizer from one frequency to another is determined by the transient response of the phase locked loop. In some applications, e.g. communications systems which employ frequency hopping, it is desirable to keep the switching speed to a minimum. However, a compromise has to be made between lock time and filtering of unwanted signal components. The wider the loop bandwidth, the faster the lock time, but the worse the filtering, and vice versa.

One known way of overcoming this limitation is that of "steering" the VCO to the desired frequency channel when a frequency hop is required. This involves breaking the loop momentarily, resetting the VCO control voltage (by some external means) at the correct level for the desired output frequency, then closing the loop again. Specifically, one known method for setting the VCO control voltage employs a digital to analogue converter (DAC) which is switched in to the filter input after the charge pump has been disabled. The DAC rapidly charges or discharges (as necessary) the filter, then the charge pump is re-enabled. Now the synthesizer is already on approximately the correct frequency, thereby saving the time taken to charge the filter using the charge pump outputs and obtain frequency acquisition. However, at this point, the two signals at the input to the phase detector are no longer in phase and this means that the loop must then obtain a phase lock. This limits the potential benefits available from the steering technique. Hence there is a need for a steered frequency synthesizer having a reduced time for achieving phase lock.

Accordingly, the present invention comprises a frequency synthesizer incorporating a phase locked loop and including:

a voltage controlled oscillator (VCO) for producing an output frequency, a frequency divider connected to an output of the VCO for producing a divided VCO output frequency, a phase detector for comparing a reference frequency with the divided VCO output frequency, means for setting a VCO control voltage, and a controller for disabling and re-enabling the phase locked loop and for resetting the frequency divider.

By providing a means for resetting a frequency divider, the frequency synthesizer of the present invention can achieve phase lock more rapidly than can a conventional device.

In one embodiment, the means for setting VCO control voltage comprises a DAC and the frequency divider is reset on the first detected edge of the reference frequency after the desired VCO voltage has been reached.

In a second embodiment, the VCO control voltage is set to the desired value by means of rapid charging (or discharging as appropriate) of a passive loop filter. The phase difference between the reference frequency and the divided VCO output is monitored until a minimum value is reached at which point the loop is re-enabled. During the phase monitoring period, the frequency divider is reset on at least one of the edges of the reference frequency.

Optionally, the second embodiment may include means for charging (or discharging as appropriate) the loop filter in a non linear manner.

BRIEF DESCRIPTION OF THE DRAWINGS

Some embodiments of the invention will now be described, by way of example only, with reference to the drawings of which

DETAILED DESCRIPTION OF THE PREFERRED EMBODIMENTS

Figure 1:
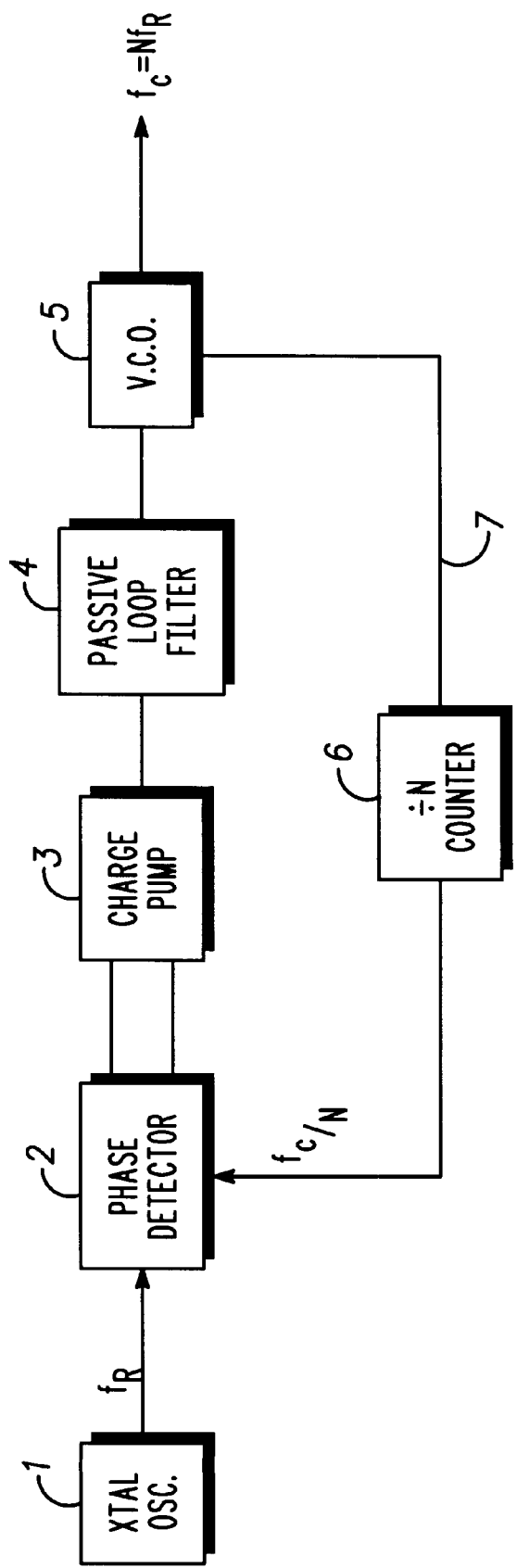
FIG. 1 is a schematic block diagram of a known frequency synthesizer incorporating a phase locked loop.
Figure 2:
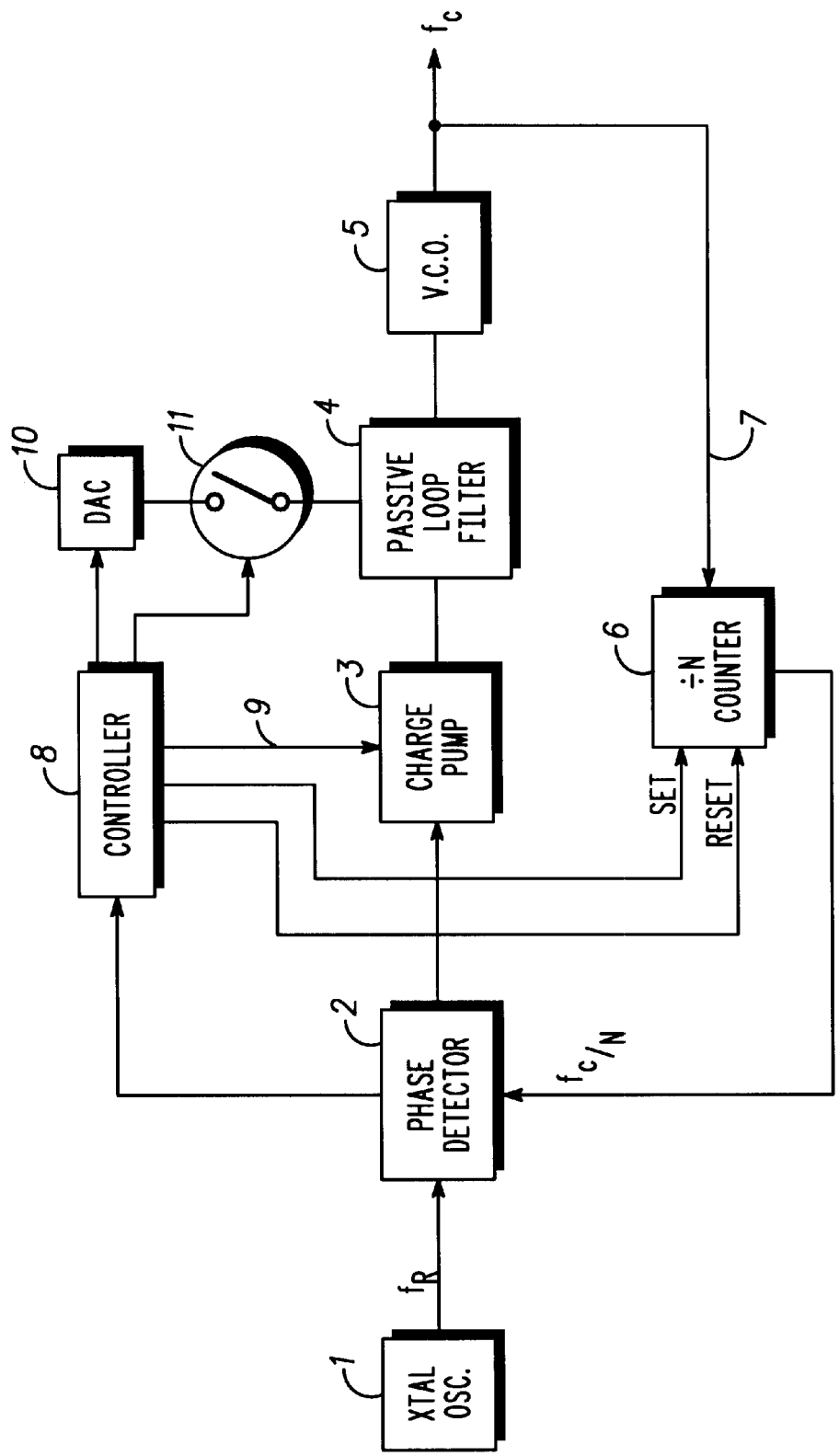
FIGS. 2 and 3 are schematic block diagrams of phase corrected frequency synthesizers recording two alternative embodiments of the invention.

The frequency synthesizer of FIG. 2 includes several components in common with the known synthesizer of FIG. 1 previously described: namely, a crystal oscillator 1, a phase detector 2, a charge pump 3, a passive loop filter 4, a VCO 5 and a ÷N (counter) 6 connected in the feedback loop 7.

Additionally, a controller 8 is provided for opening and closing the loop 7 and for setting and resetting the . N (counter) 6.

The controller 8 has an input from the phase detector 2 and a plurality of outputs. One output provides a disabling/enabling signal on line 9 to the charge pump 3. One further output switches a connection from a DAC 10 to the loop filter 4 via a switch 11. A third output controls the output of the DAC 10. Two further outputs from the controller 8 are connected to the ÷N (counter) 6. One sets the value of N, thereby controlling the output frequency $f_c$ of the synthesizer and the other resets the ÷N (counter) 6 in response to the input signal from the phase detector 2.

In operation, when it is desired to change the output of the synthesizer to a new value, the controller 8 sets the ÷N (counter) 6 to the necessary value for N, sets a DAC 10 input address to the necessary value for achieving the required VCO 5 control voltage, opens the loop by disabling the current supply from the charge pump 3 to the loop filter 4 and switches in the DAC 10 to the loop filter 4 by closing the switch 11.

Thus, while the loop 7 is broken, the VCO 5 is steered to the new frequency value.

Then the DAC 10 is switched out again and the loop 7 is closed by re-enabling the charge pump 3 so that it can supply current to the loop filter 4.

Next, in order to line up the phases of the two input signals to the phase detector 2, the controller 8 resets the ÷N (counter) 6 at the moment when the phase detector 2 detects the arrival of the first edge of the reference signal $f_R$ after the loop has been closed and signals this to the controller 8. The ÷N (counter) 6 may be reset to 0 for a count up operation or to N for a count down operation. The first edge detected may be a rising or falling edge.

By resetting the ± N (counter) 6 as described above, the edges of both the phase detector inputs are coincident and therefore the phases are aligned. Hence, the synthesizer is accurate in both frequency and phase with the phase alignment being rapidly achieved compared with the conventional system which relies on settling of the loop.

In practice, there are some limitations to the phase alignment system of FIG. 2. For instance, absolute frequency accuracy is limited by the resolution of the DAC and of the DAC-VCO calibration.

These limitations can be overcome by employing the second embodiment.

A second embodiment, now to be described with reference to FIG. 3 shares some features in common with the first embodiment of FIG. 2, such features being ascribed like reference numerals. However, this second embodiment does not employ a DAC to steer the VCO voltage during disabling of the loop.

In operation, when it is desired to set the VCO 5 to a new frequency, the controller 8 sets the value of N in the ÷N (counter) to the required value and breaks the loop 7 by disabling the charge pump 3 from the phase detector's "up" and "down" outputs. Now that the charge pump 3 is no longer under the control of the phase detector 2, it can be turned on continuously either sourcing current to or sinking current from the loop filter according to a direction of frequency change. The current is fed to each node of the passive loop filter 4 so that the resistors in its RC networks are effectively shorted and the loop filter acts as a single capacitor. In this way, the VCO 5 output is quickly steered to the desired value and during this steering period, the ÷N counter 6 is reset by the controller 8 on every detected rising edge of the reference signal. (Alternatively, the ÷N counter may be reset on every falling edge of the reference signal).

A first method that can be used to determine when to reintroduce conventional closed loop control is as follows. Within each cycle, the time difference between the edges at the input to the phase detector 2 is an indication of the VCO frequency error. It should be noted that the VCO control voltage is constantly changing (i.e. is linearly increasing or decreasing the time) and hence the number output cycles of the VCO during the reference period is proportional to the integral of this voltage.

Assume that the synthesizer is hopping down in frequency and the value N has been decreased. The charge pump 3 withdraws current and the capacitors in the loop filter 4 are discharged. Since the output frequency of the VCO 5 is being reduced, the N samples will be counted by the ÷N (counter) in less than 1 cycle of the reference frequency. Hence, the rising edge of the feedback signal $f_c/N$ will occur at the phase detector 2 input before that of the reference. When the reference signal edge arrives, the feedback ÷N (counter) 6 will have reached 0 and started to count down from N again. It will be at value N1, say, where N1 is less than N. The difference between N and N1 is equal to the number of output cycles that have been counted by the divider.

Consider the effect as the VCO outputs fall in frequency. At some point in time, the control voltage will fall fractionally below that which is required. On this cycle, the reference edge will occur before the feedback edge. This is detected using simple logic circuitry in the phase detector 2 and is relayed to the controller 8. Hence, the synthesizer can detect an overshoot on the decreasing control line voltage. At this point, the controller 8 switches the phase detector 2 up/down outputs back to controlling the charge pump 3 in the standard manner to complete the locking process and the counter resetting process is curtailed.

Similarly, when the synthesizer is hopping up in frequency, the feedback edge will occur before the reference edge after the over shoot has occurred.

The above method relies on an over shoot detection technique to determine the point when the phase detector output should be re-enabled and the loop closed. This is relatively straight forward to implement, and in the case where the sampling is rapid, this will be acceptable as the over shoot will be small. As the phase has been reset, the frequency and phase errors will be small provided that the sampling period is short compared with the charging time.

Figure 3:
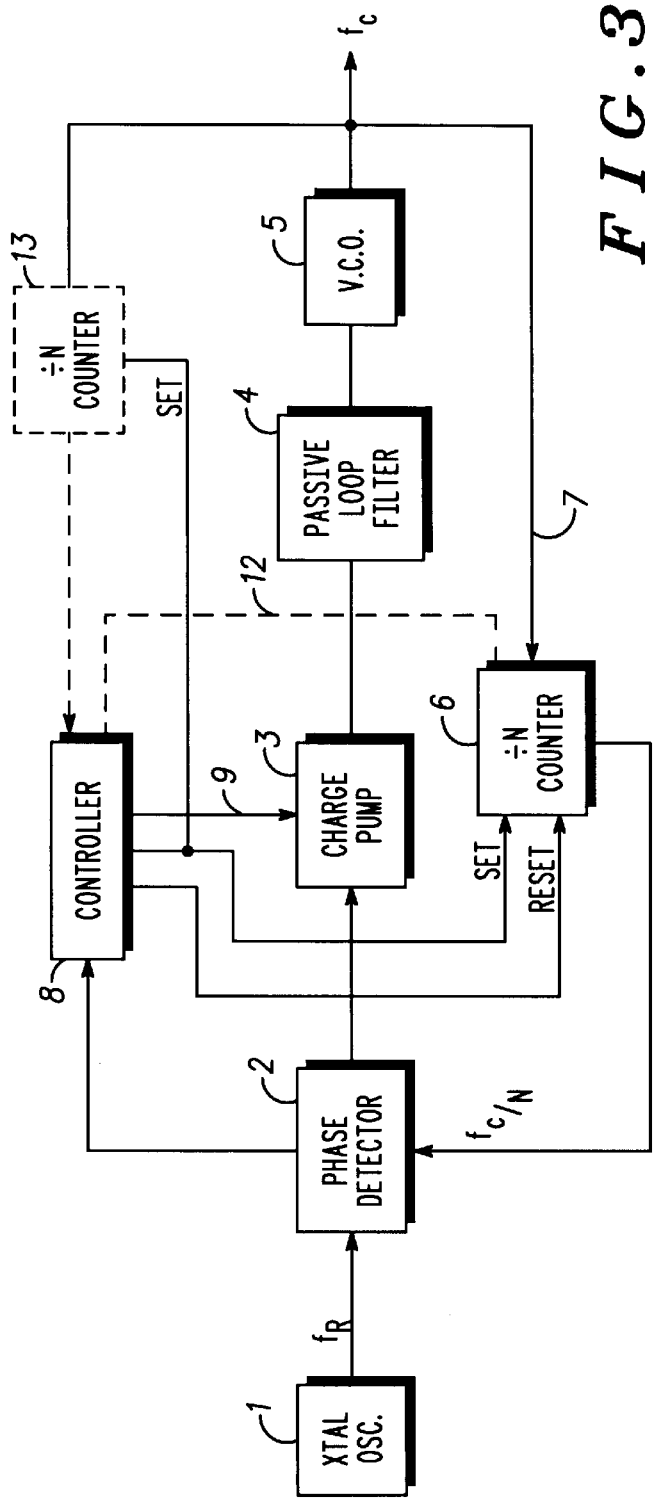

Two further alternative methods of determining when to re-introduce conventional closed loop control in the embodiment of FIG. 3 use a measurement (performed in the controller 8) of the error between the input signals to the phase detector in order to estimate when the phase detector 2 should be switched on after the rapid charge stage.

When the constant charge configuration is in use, the phase detector outputs can give information about the state of the loop. For instance, in a second alternative method, the time T, between the rising edges of the two inputs to the phase detector 2 can be used by the controller 8 to determine frequency error. With knowledge of the reference period and the value of N, the frequency error can be calculated. Therefore, the point at which the output frequency of the VCO 5 attains the desired value can be predicted by the controller 8. At this point in time, the loop is re-enabled and the last reset operation is performed on the first occurring edge (rising or falling) of the reference signal.

Resetting the ÷N (counter) 6 on every reference frequency rising edge (or alternatively every falling edge) during disabling of the loop is possible for the count down case (i.e. a decrease in frequency) but in the case of a frequency hop going up in frequency, the $f_c/N$ pulse will occur after the reference pulse as long as the VCO 5 is below its target. In order to measure the time T, the ÷N (counter) 6 must be reset every two reference cycles.

Measuring T is a preferred option for synthesizers with a low output frequency. For a RF synthesizer, a preferred solution is to use the actual N counter values. In this third alternative method, the value of counter error on successive cycles is used to track the frequency error. For this option, a link 12 from the counter output to the controller 8 is needed, the link being shown ghosted in FIG. 3.

As in the first method, the N counter 6 is reset on every reference frequency rising edge (or alternatively every falling edge) while the loop 7 is disabled. The controller 8 can determine at what point in the cycle it estimates the frequency to be correct, and this can be timed by counting the values in the N counter and, at the appropriate time (i.e. counter value), the phase detector connection to the charge pump is reactivated. The final phase synchronization is performed at the next reference edge, at which time the frequency of the VCO output signal will be reasonably accurate. The synthesizer must, however, lock correctly in both frequency and phase, once the loop is re-enabled and the time taken to achieve this will depend upon how much error remains to be eliminated.

The practical implementation of these techniques (previously described with reference to FIG. 3) will depend upon the requirements of the synthesizer. Further, the third method described, that of using the counter value information to estimate error, contains the limitation that since the counter 6 is only clocked once per output cycle, the accuracy of the frequency estimation is subject to a quantitization error equal to the reference frequency.

A simple example illustrates this point. Let the desired value for the VCO output $f_c$ be equal to 1 MHz, and N equal to 1,000. The reference frequency $f_R$ is 1 Khz. Assume that $f_c$ is actually 999 kHz. In this case only 999 cycles are clocked in so there is an error of 1 kHz. Next, assume that $f_c$ is 999.999 kHz. Still only 999 cycles are clocked in, so the error is measured to be the same. Similarly, the results are the same for 1000.000 kHz and 1000.999 kHz i.e. there is an ambiguity equal to the reference frequency.

The invention provides a means for reducing this ambiguity, the means being a separate second ÷N (counter) 13 (shown ghosted in FIG. 3) and having an output connected to the controller 8, which clocks on the opposite edge of the VCO signal. If the first counter 6 counts the number of rising edges, information is still available within the loop that can be used. For a 50:50 duty cycle, the opposite (falling) edge (clocked by the second counter 13) shows that the VCO 5 is half way through the cycle. This reduces the inaccuracy of the frequency estimation to only half the reference frequency by the addition of this small amount of extra circuitry.

The techniques described with reference to FIG. 3 have a draw back, which is that a constant current source driving a capacitor will lead to a linearly increasing voltage with time. Consider the synthesizer being required to hop between the number of discrete frequency channels. The ideal sampling method used in this fast charge synthesizer would be to use at least one comparison cycle per channel, especially in the simple overshoot detection configuration. This prevents the loop overshooting the desired frequency by more than one channel. However, it also defines the minimum charging time, which becomes equal to the number of channels multiplied by the reference cycle time. It would be preferable to have a faster rate of change at the beginning of the hop, covering several channels per cycle, and reducing to less than or equal to one channel per cycle at the end.

This can be achieved by providing a complex variable-current source. Alternatively, a simpler arrangement may comprise a switchable voltage source 14 for driving the loop filter 4 (see FIG. 4).

At the beginning of the hop, the charge pump 3 is disabled and the loop filter resistors are shorted to create the single capacitor. The passive loop filter 4 is connected via one of two switches 14 and 15 to either a voltage Vcc or to ground in order to charge or discharge the loop filter 4 as appropriate.

The instantaneous current flowing into the loop filter 4 is $\Delta V/R$ where $\Delta V$ is the voltage across the resistor R and equal to the difference between the VCO control voltage and either $V_{cc}$ or ground.

Consider the effect if the loop capacitors are to be charged from 1 volt to 4 volts where $V_{cc}$ is equal to 5 volts. Between these ranges, the current will change by factor of 4 to 1 with a corresponding rate of change of frequency. This decelerating frequency hop allows the wanted band to be reached in fewer cycles than would be required using a linear constant current source. i.e. the VCO voltage rises exponentially.

Consider a synthesizer for use in a cellular communication system which employs frequency hopping. Assume the largest frequency hop is 34.6 MHz using a VCO with tuning from 1 volts to 4 volts. The required hop control voltage is 3 volts, covering 173 channels assuming that the reference frequency is 13 MHz having a period of 77 nS. Let the total capacitance of the loop filter 4 be 20 nF.

If a linear constant charge method is used and if the charging current is chosen to give a rate of change of one channel per cycle, the total time to complete the frequency hop will be 173×77 nS which equals 13.3 $\mu$s. This is longer than the time period in which the synthesizer-should ideally lock. To decrease the time taken, the current would have to be set to charge the filter at rate of more than one channel per cycle which would contribute to a higher error, in particular, in the overshoot detection method previously described.

Figure 4:
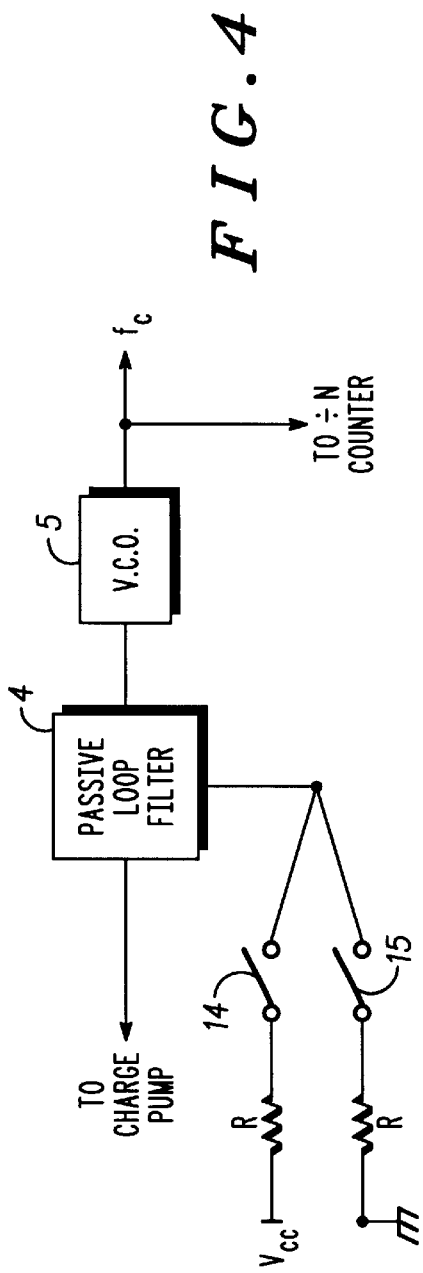
FIG. 4 is a schematic block diagram of selected components illustrating a refinement to the arrangements of FIG. 3.

However, using the modification of FIG. 4 with R set at 240Ω say, the time to charge from 1 volt to 4 volts is only 6.65 $\mu$s. The phase error can be corrected once reasonable frequency accuracy, has been achieved. Then the loop is switched back to normal operation. This phase correction process can be done in accordance with any of the methods described with reference to FIG. 3.

For hops of only a few channels, the linear constant current method may be faster because the charge pump current can be chosen to give a rate of change of e.g. half a channel per reference period.

An alternative arrangement is to use more than one switching resistor to allow optimum charging/discharging characteristics for a particular distance of hop. In the above example of FIG. 4, a resistor value of 300 Ω can be beneficial for smaller distance frequency hops.

As a general technique, not specific to any particular cellular communications system, a selection of resistors switched in as required or some conventional method of controlling the current in an appropriate non-linear fashion, would improve the functionality of the synthesizer and allow fast accurate hopping under all conditions.

All the aforementioned embodiments described with reference to FIGS. 2, 3, and 4 can advantageously be employed in the transceiver of a cellular communication system which employs frequency hopping. A particular advantage can be obtained for Time Division Multiple Access systems which use a "ping-pong" arrangement of two synthesizers where one is used as the main local oscillator to the transmitter or receiver mixer whilst the other synthesizer is hopping to the next frequency, the situation being reversed on a time slot basis. Using the invention, phase and frequency accuracy can be obtained during the guard period between time slots, thereby eliminating the need for the second synthesizer and its associated switching network.

I claim:

1. A frequency synthesizer incorporating a phase locked loop and comprising:
   a voltage controlled oscillator (VCO) for producing an output frequency;
   a frequency divider connected to an output of the VCO for producing a divided VCO output frequency;
   a phase detector for comparing a reference frequency with the divided VCO output frequency;
   means for setting a VCO control voltage comprising a current source; and
   a controller for disabling and re-enabling the phase locked loop, for monitoring a phase error between the reference frequency and the divided VCO output frequency and for resetting the frequency divider on every successive detected rising edge of the reference frequency after disabling the phase locked loop and to re-enable the phase locked loop when the phase error reaches a minimum value.

2. A frequency synthesizer as claimed in claim 1 in which the controller is adapted to reset the frequency divider on every successive detected falling edge of the reference frequency after disabling the phase locked loop.

3. A frequency synthesizer as claimed in claim 2 in which the minimum value is determined by detecting an overshoot of the VCO control voltage.

4. A frequency synthesizer as claimed in claim 2 in which the frequency divider comprises a first ÷N (counter) and in which the minimum value is determined by a prediction based on the counter value.

5. A frequency synthesizer as claimed in claim 4 and further comprising a second ÷N (counter) for counting those edges of the VCO output frequency opposite to those counted by the first ÷N (counter) and in which the minimum value is detected by a prediction based on the values of both first and second ÷N (counters).

6. A frequency synthesizer as claimed in claim 1 in which the minimum value is determined by detecting an overshoot of the VCO control voltage.

7. A frequency synthesizer as claimed in claim 1 in which the controller is adapted to reset the frequency divider on every other detected rising edge of the reference frequency after disabling the phase locked loop.

8. A frequency synthesizer as claimed in claim 7 in which the minimum value is determined by a prediction based on a measurement of the time difference between detected edges of the reference frequency and the divided VCO output frequency.

9. A frequency synthesizer as claimed in claim 1 in which the controller is adapted to reset the frequency divider on every other detected falling edge of the reference frequency after disabling the phase locked loop.

10. A frequency synthesizer as claimed in claim 9 in which the minimum value is determined by a prediction based on a measurement of the time difference between detected edges of the reference frequency and the divided VCO output frequency.

11. A frequency synthesizer as claimed in claim 1 in which the minimum value is determined by a prediction based on a measurement of the time difference between detected edges of the reference frequency and the divided VCO output frequency.

12. A frequency synthesizer as claimed in claim 1 in which the frequency divider comprises a first ÷N (counter) and in which the minimum value is determined by a prediction based on the counter value.

13. A frequency synthesizer as claimed in claim 12 and further comprising a second ÷N (counter) for counting those edges of the VCO output frequency opposite to those counted by the first ÷N (counter) and in which the minimum value is detected by a prediction based on the values of both first and second ÷N (counters).

* * * * *